US007927156B2

(12) United States Patent
Appel et al.

(10) Patent No.: US 7,927,156 B2
(45) Date of Patent: Apr. 19, 2011

(54) ELECTRICAL CONNECTOR ELEMENT

(75) Inventors: Wilhelm Appel, Laa a.d. Thaya (AT);
Bernhard Eichhorner, Vienna (AU);
Wolfgang Peprny, Vienna (AU); Martin Petricek, Hollabrunn (AU); Arnold Schönleitner, Purkersdorf (AU)

(73) Assignee: Siemens AG Oesterreich, Vienna (AT)

( * ) Notice: Subject to any disclaimer, the term of this patent is extended or adjusted under 35 U.S.C. 154(b) by 0 days.

(21) Appl. No.: 12/513,581

(22) PCT Filed: Sep. 26, 2007

(86) PCT No.: PCT/EP2007/060177
§ 371 (c)(1),
(2), (4) Date: Jan. 12, 2010

(87) PCT Pub. No.: WO2008/055746
PCT Pub. Date: May 15, 2008

(65) Prior Publication Data
US 2010/0136807 A1 Jun. 3, 2010

(30) Foreign Application Priority Data
Nov. 6, 2006 (DE) .......................... 10 2006 052 211

(51) Int. Cl.
*H01R 33/05* (2006.01)
(52) U.S. Cl. ...................................................... 439/709
(58) Field of Classification Search .................. 439/709, 439/83, 357, 797, 801, 802, 573, 710, 934
See application file for complete search history.

(56) References Cited

U.S. PATENT DOCUMENTS

| 3,760,330 | A | * | 9/1973 | Bennett et al. | 439/189 |
| 4,595,248 | A | * | 6/1986 | Brown | 439/83 |
| 4,924,213 | A | * | 5/1990 | Decho et al. | 340/653 |
| D328,059 | S | * | 7/1992 | DeSantis | D13/154 |
| 5,203,716 | A | * | 4/1993 | Martucci et al. | 439/411 |
| 5,291,376 | A | * | 3/1994 | Mills | 361/823 |
| 5,336,113 | A | * | 8/1994 | Chanteau | 439/581 |
| 5,340,216 | A | * | 8/1994 | Goldschmidt | 374/182 |
| 5,470,795 | A | * | 11/1995 | Shushurin | 438/107 |
| 5,727,314 | A | * | 3/1998 | Ashcraft | 29/884 |
| 5,788,539 | A | * | 8/1998 | Fedder | 439/682 |
| 6,146,181 | A | * | 11/2000 | Plaza | 439/357 |

(Continued)

FOREIGN PATENT DOCUMENTS
DE 3901307 C2 3/1994
(Continued)

OTHER PUBLICATIONS

Weidmüller GmbH & Co. KG, "Katalog III. 2004/2005", Leiterplattenprodukte, Paderborn, pp. A.8-A.9, E.22-E.25, Best.nr.: 5638000000/Nov. 2003; Others; 2004; DE.

*Primary Examiner* — T C Patel
*Assistant Examiner* — Harshad C Patel

(57) ABSTRACT

An electrical connector element for connection of a conductor to a circuit board, having a housing, at least one clamp connector for the conductor and at least two connector pins for preferably soldered connection to the circuit board, is disclosed. The housing has at least one separating element made from insulating material, projecting from the lower side, facing away from the circuit board in the assembled position, at least partly arranged between the connector pins and extending through the circuit board in the assembled position, in order to permit the connector pins of the electrical connector element to be arranged closer together.

16 Claims, 5 Drawing Sheets

U.S. PATENT DOCUMENTS

| | | | |
|---|---|---|---|
| 6,176,710 B1 * | 1/2001 | Ewing et al. | 439/76.1 |
| 6,210,239 B1 * | 4/2001 | Harting et al. | 439/814 |
| 6,764,355 B2 * | 7/2004 | Ude et al. | 439/811 |
| 6,860,765 B1 * | 3/2005 | Spink, Jr. | 439/680 |
| 7,048,591 B1 * | 5/2006 | Chiang | 439/709 |
| D536,307 S * | 2/2007 | Rizzo et al. | D13/149 |
| 7,247,033 B2 * | 7/2007 | Skowranek | 439/79 |
| 7,413,487 B1 * | 8/2008 | Chen | 439/811 |
| 7,445,526 B2 * | 11/2008 | Neese et al. | 439/811 |
| 7,458,861 B1 * | 12/2008 | Eke et al. | 439/798 |
| 7,534,151 B1 * | 5/2009 | Billerbeck | 439/793 |
| 2002/0061675 A1 * | 5/2002 | Borst | 439/404 |
| 2003/0124915 A1 * | 7/2003 | Kaine et al. | 439/798 |
| 2005/0042933 A1 * | 2/2005 | Cisey | 439/709 |
| 2006/0199439 A1 * | 9/2006 | Mertz et al. | 439/709 |

FOREIGN PATENT DOCUMENTS

| | | |
|---|---|---|
| DE | 9412680 U1 | 12/1995 |
| DE | 19524850 A1 | 2/1996 |
| DE | 19757938 A1 | 7/1999 |
| DE | 202005017012 U1 | 1/2006 |
| EP | 0704942 A2 | 4/1996 |
| EP | 1006617 A2 | 6/2000 |
| EP | 1703597 A1 | 9/2006 |
| SU | 1277440 A1 | 12/1985 |

* cited by examiner

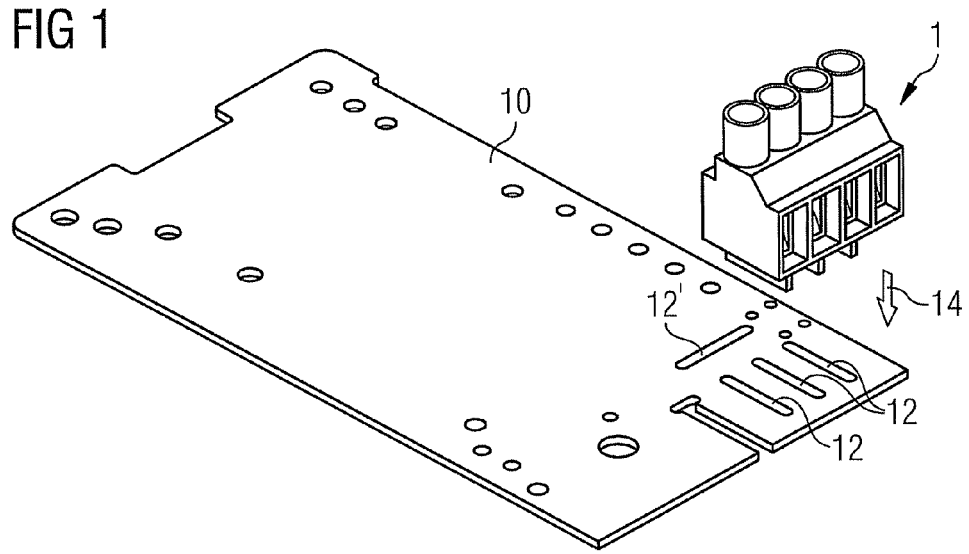
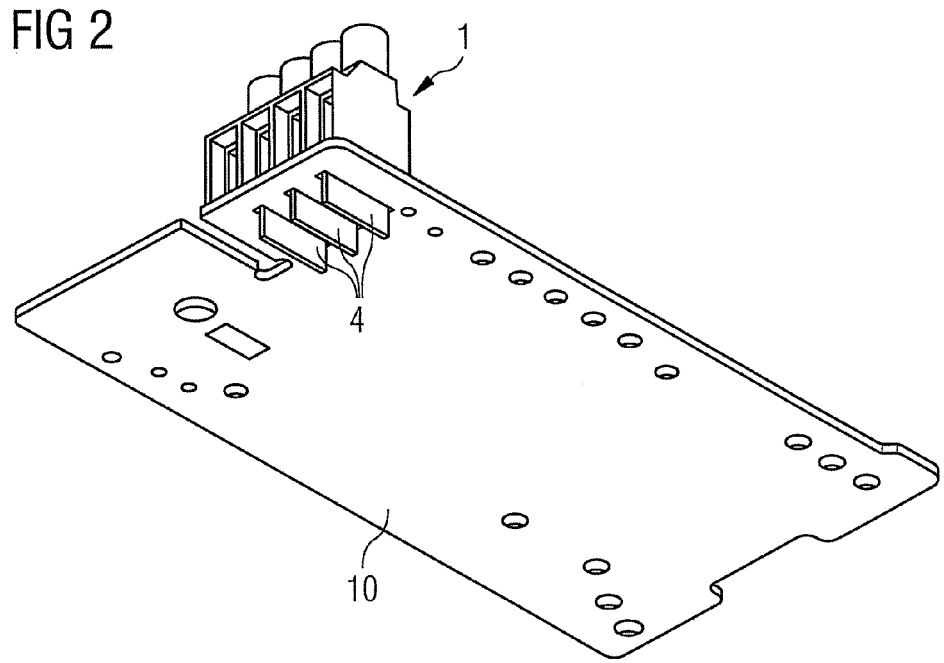

ELECTRICAL CONNECTOR ELEMENT

CROSS REFERENCE TO RELATED APPLICATIONS

This application is the US National Stage of International Application No. PCT/EP2007/060177 filed Sep. 26, 2007 and claims the benefit thereof. The International Application claims the benefits of German Patent Application No. 10 2006 052 211.7 DE filed Nov. 6, 2006, both of the applications are incorporated by reference herein in their entirety.

FIELD OF INVENTION

The present invention relates to an electrical connector element for connecting a conductor to a printed circuit board or to conductor tracks disposed thereon, having a housing, at least one clamp connector for the conductor and at least two connector pins for preferably solderable connection to the printed circuit board or conductor tracks, and an arrangement having a printed circuit board with an upper face and a lower face and an electrical connector element that can be assembled on the upper face of the printed circuit board to connect a conductor, the electrical connector element having a housing, at least one clamp connector for the conductor and at least two connector pins for preferably solderable connection to the printed circuit board, and the printed circuit board is provided with openings to hold the connector pins.

BACKGROUND OF INVENTION

Electrical connector elements are used in a very wide range of embodiments to connect a generally cable-type conductor to a printed circuit board PCB or to conductor tracks disposed thereon.

Such electrical connector elements are secured to the printed circuit board by means of projecting contact elements, referred to hereafter as connector pins, which in the assembled position are connected in an electrically conducting manner to assigned conductor tracks provided on the printed circuit board. The connector pins are also referred to as solder pins, because they generally engage in openings or holes already present in the printed circuit board and are then soldered to the printed circuit board.

There are numerous variants of connector pins, generally with a round or rectangular cross-section.

The high density of the arrangement of components provided on the printed circuit board means that the smallest possible dimensioning of the electrical connector elements is also desirable.

However the reduction in the size of electrical connector elements reaches a limit due to the safe distance required between the individual connector pins.

Such safe distances are generally required by standard for the reliable prevention of flashover and therefore a short circuit between adjacent connector pins and vary depending on the size of the voltage present at the electrical connector element or at the connector pins.

The specific voltage required to allow current to flow through an insulator, in the case of generic printed circuit board arrangements in particular the air between the adjacent connector pins, is essentially proportional to the length of the path hereafter referred to as the "voltage path", which the electrons have to cover through the insulator or air to travel from one connector pin to the next connector pin and cause a short circuit. A material-specific electric strength is therefore also specified in the unit [V/mm]. Plastic here has a roughly ten to forty times higher electric strength than the medium air.

The safe distance mentioned above corresponds in conventional electrical connector elements to the voltage path, which is essentially the same as the gap between two connector pins. More precisely the safe distance or voltage path is generally measured as the direct distance between the outer sleeves of two connector pins on a putative connecting line in a normal direction to the axes of the connector pins which generally run in the insertion direction of the electrical connector element, with a safe distance thus measured also being referred to as an "air path".

Parallel to this a further safe distance is also defined in respect of a "creepage path" the current has to cover along the surface of the printed circuit board to travel from one connector pin to the next. The prescribed "creepage path" safe distance is generally considerably greater than the "air path" safe distance, as the surface of the printed circuit board can become dirty during operation and the dirt adhering to the surface of the printed circuit board, in some instances combined with the presence of a high level of air humidity and condensation of moisture from the air on the printed circuit board, facilitates a short circuit between two connector pins.

The safe distances required by standard are subject not only to the performance category of the electrical connector elements but also to further factors, such as the area of operation of the electrical connector elements, for example whether they are deployed in industrial or domestic networks.

If the printed circuit board also has metal edgings in the region of the openings provided to hold the connector pins, the effective voltage path or "creepage path" the current has to cover between two connector pins can be further reduced. The layer thickness of the solder material used to solder the connector pins to the printed circuit board should also be taken into account here.

SUMMARY OF INVENTION

An object of the present invention is to insulate the individual connector pins from one another to prevent flashover between them. In particular it should be possible to dispose the connector pins of the electrical connector element closer to one another, thereby allowing a more compact structure of the electrical connector element than is the case with conventional connector elements or where the described safe distances are predetermined. Despite the shorter distance between the connector pins, adequate protection against the risk of flashover between adjacent connector pins should however be ensured.

The object is achieved by an electrical connector element and by an arrangement as claimed in the independent claims.

A generic electrical connector element for connecting a conductor to a printed circuit board or to conductor tracks disposed thereon comprises a housing, at least one clamp connector for the conductor and at least two connector pins for preferably solderable connection to the printed circuit board. In its assembled position the housing has at least one projecting separating element made of an insulating material on a lower face facing the printed circuit board, at least part of which is disposed between the connector pins and which extends through the printed circuit board in the assembled position.

In this manner adjacent connector pins are thus shielded from one another in an insulating manner and/or the electric strength of the region between two adjacent connector pins is increased, this having been fowled only by the medium air until now in the case of conventional electrical connector elements.

The length of the voltage path between the connector pins no longer results in the manner described above as a linear normal distance between two connector pins but now corresponds to the hypothetical path the current present at a connector pin has to take to travel over or round the surface of the separating element to reach the next adjacent connector pin.

It is evident that the separating element here must have a certain minimum thickness in order not to be subject to dielectric breakdown.

By providing a separating element the voltage path (both the "creepage path" and "air path" described above) can be significantly increased and the distances between the connector pins reduced without a safety risk or short circuit hazard resulting. Because the connector pins can henceforth be closer to one another, the space required for the electrical connector element is reduced compared with conventional electrical connector elements. The smaller finished state of the electrical connector element enabled as a result also has a cost benefit both for the manufacture of connector elements and also the manufacture of corresponding printed circuit boards, which can likewise be of smaller dimensions.

The separating element projects in an essentially normal direction from the lower face of the housing, and the separating element is disposed in the center between two adjacent connector pins and preferably extends in a normal direction to an axial distance between the connector pins. Therefore, it is possible to optimize the material outlay for the separating elements and it is simple to achieve compatibility in respect of the insertion capability of the separating elements in the printed circuit board.

By selecting the length of the projecting separating element measured from the lower face of the housing and extending in the direction of the printed circuit board in the assembled position and the width of the separating element running along the lower face of the housing respectively in such a manner that both an "air path" to be covered by the current present at the connector pins to travel round the separating element and causing a short circuit between two adjacent connector pins and a "creepage path" running along a lower face of the printed circuit board and the upper face of the separating element, also to be covered by the current to travel round the separating element and causing a short circuit between two adjacent connector pins respectively are at least as large, preferably larger than a corresponding "air path" safe distance or "creepage path" safe distance required by standard, flashover between adjacent connector pins is reliably prevented.

The separating element can be produced as an integral part of the housing. This enables simple and cost-effective manufacture.

The electrical connector element is made of plastic. Plastic material generally has a good insulating effect and/or electric strength and is therefore particularly suitable for shielding adjacent connector pins from one another.

The separating element is configured as essentially rectangular, making it simple to produce. The rectangular form preferably has rounded or chamfered regions, to allow better insertion capability for the separating elements and to save material.

To achieve a better insulating effect, the separating element is in the form of a shaft with any number of the connector pins being surrounded at least partially by the separating element in a plan view normal to the lower face of the printed circuit board.

It is also possible, where a number of electrical connector elements are disposed adjoining one another on the printed circuit board, to provide any number of additional separating elements on the lower face of the housing, these being disposed between the connector pins of a first electrical connector element and the connector pins of an adjoining further electrical connector element.

An arrangement has a printed circuit board with an upper face (also referred to as the "assembly face") and a lower face (also referred to as the "solder face") and an electrical connector element that can be assembled on the upper face of the printed circuit board to connect a conductor to conductor tracks disposed on the printed circuit board, the electrical connector element having a housing, at least one clamp connector for the conductor and at least two connector pins for preferably solderable connection to the printed circuit board and/or the conductor tracks and the printed circuit board is provided with openings to hold the connector pins. In order to enable the insulating effect described above and/or smaller distances between the individual connector pins and reliably exclude flashover between adjacent connector pins, in the assembled state of the arrangement at least one separating element made of insulating material and disposed at least partially between the connector pins is provided.

In one preferred embodiment, the separating element is disposed on a lower face of the housing of the electrical connector element facing the printed circuit board and is preferably produced as an integral part of the housing. The printed circuit board here is provided with at least one additional opening, through which the separating element extends.

In one alternative structure, it is however also possible for the separating element to be disposed on a lower face of the printed circuit board opposite an assembly face and preferably to be embodied as an integral part of the printed circuit board. With such a mode of embodiment it may in some instances be necessary to provide an insulating layer, of plastic for example, between the upper face of the printed circuit board and the lower face of the connector element housing, to prevent flashover between two adjacent connector pins in that region.

The separating element provided in the arrangement extends in an essentially normal direction to a plane formed by the printed circuit board, in other words projects in a perpendicular manner from the lower face of the housing or in a perpendicular manner from the lower face of the printed circuit board.

The separating element is disposed in the center between two adjacent connector pins and extends preferably in a normal direction to an axial distance between the two connector pins.

The length of the separating element measured from the lower face of the printed circuit board and the width of the separating element running normal to this respectively are selected in such a manner that both an "air path" to be covered by the current present at the connector pins to travel round the separating element and causing a short circuit between two adjacent connector pins and a "creepage path" running along a lower face of the printed circuit board and the upper face of the separating element to be covered by the current to travel round the separating element and causing a short circuit between two adjacent connector pins respectively are at least as large, preferably larger than the corresponding "creepage path" safe distance and/or "air path" safe distance required by standard.

While achieving the advantages already listed, the separating element is made of plastic.

The separating element is configured as rectangular, it being possible for the rectangular form also to be rounded or chamfered.

The separating element can be embodied in the form of a shaft, with any number of the connector pins being surrounded at least partially by the separating element in a plan view normal to the lower face of the printed circuit board.

If a number of electrical connector elements are disposed adjacent to or adjoining one another on the printed circuit board, at least one additional separating element can also be provided, which is disposed between the connector pins of a first electrical connector element and the connector pins of an adjoining second electrical connector element and extends through a further additional opening in the printed circuit board.

BRIEF DESCRIPTION OF THE DRAWINGS

The invention is described in more detail below with reference to exemplary embodiments. In the drawings:

FIG. 1 shows a schematic diagram of an axonometric exploded view of an arrangement FIG. 2 shows a schematic diagram of an arrangement according to FIG. 1 in the assembled position

DETAILED DESCRIPTION OF INVENTION

FIG. 1 shows an electrical connector element 1, which can be attached manually or in an automated manner to a printed circuit board 10 in the insertion direction 14 (see also FIG. 2).

Figure 3:
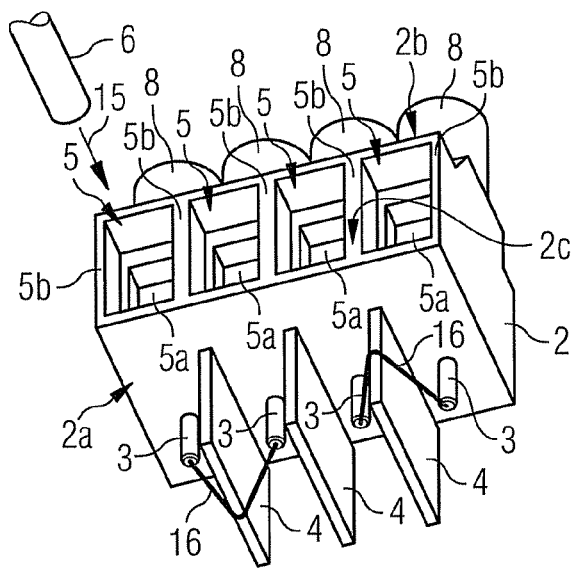
FIG. 3 shows a schematic diagram of an oblique view of the electrical connector element
Figure 4:
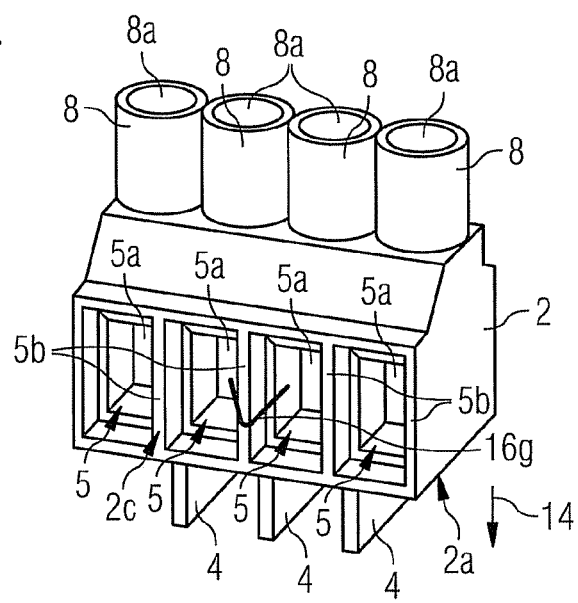
FIG. 4 shows a schematic diagram of an oblique view of the electrical connector element
Figure 5:
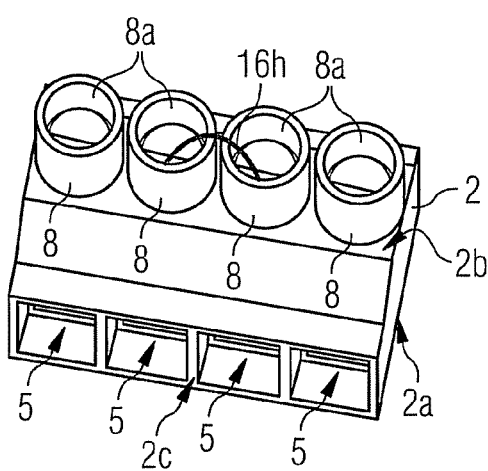
FIG. 5 shows a schematic diagram of an oblique view of the electrical connector element

The electrical connector element 1, which can be seen in more detail in FIGS. 3 to 5, has a housing 2, which is preferably made of plastic and is provided on its front face 2c with a number of clamp connectors 5, with a holder 5a being formed respectively by web-like walls 5b. A conductor 6 can be introduced respectively into the holder 5a of the clamp connector 5 in an insertion direction 15 and can be fixed by means of actuation elements 7 disposed in the housing 2 (see sectional view in FIG. 6).

The actuation elements 7 can be screw or pressure elements for example, which bring about clamping of the conductor 6 inserted into the clamp connector 5 against a clamping cage 9 disposed in the housing 2 in the known manner.

According to FIGS. 3 to 5 the housing 2 has integrally molded, generally tubular molded elements 8 on an upper face 2b facing away from the printed circuit board 10 in the assembled position, each fowling an opening 8a, into which a tool, e.g. a screw driver, can be inserted to actuate the actuation elements 7 disposed within the housing 2 to release or secure the conductor 6.

Any number of connector pins 3 project out of a lower face 2a of the housing 2 facing the printed circuit board 10 in the assembled position in the insertion direction 14 running perpendicular to the lower face 2a, these being provided for connection to conductor tracks (not shown) of the printed circuit board 10.

Figure 8:
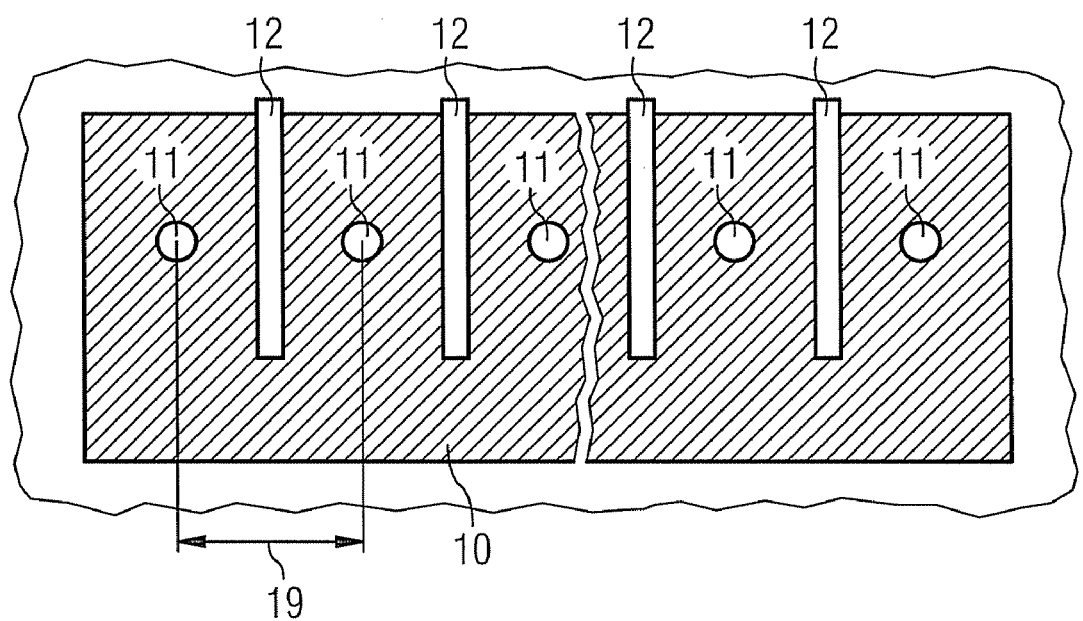
FIG. 8 shows a schematic diagram of a plan view of a region of a printed circuit board with openings.

The connector pins 3 are electrical contacts projecting in the manner of rods, which engage in corresponding openings 11 or holes in the printed circuit board 10 and are then soldered to this (see FIG. 8).

The connector pins 3 can be embodied in many different ways and have for example round, rectangular or square cross-sections. The connector pins 3 are generally produced by stamping from flat material.

Figure 6:
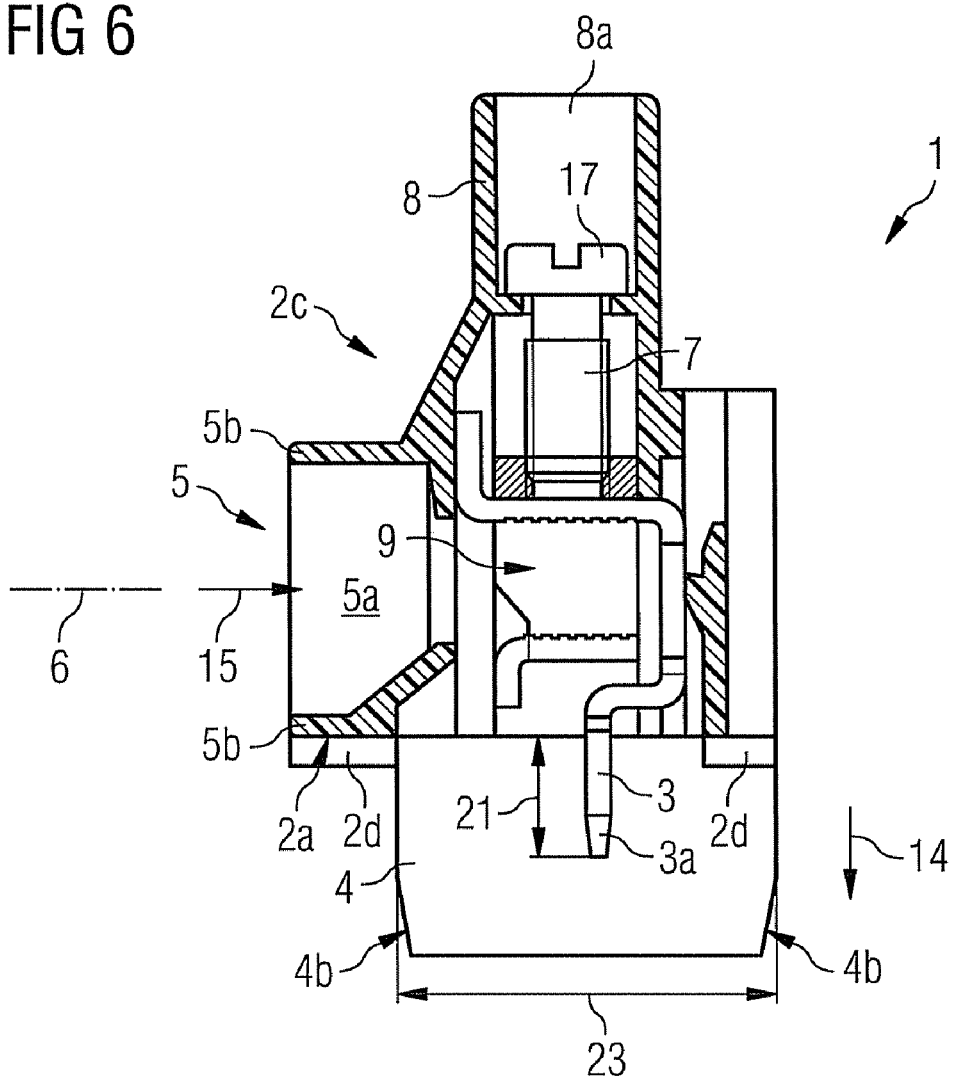
FIG. 6 shows a sectional side view of an electrical connector element

The clamp connectors 5 and connector pins 3 disposed above one another are connected respectively to one another in a conducting manner. The connector pin 3 is connected for example to the clamping cages 9 of the clamp connector 5, penetrates the lower face 2a of the housing 2 and projects beyond the lower face 2a by a length 21 (FIG. 6).

The connector pin 3 is generally soldered using a solder material 20 on a lower face 10b or solder face of the printed circuit board 10 facing away from the inserted electrical connector element 1, after the electrical connector element 1 has been positioned on an upper face 10a or assembly face of the printed circuit board 10 and the connector pins 3 project through the printed circuit board 10 in the region of the openings 11 (see FIG. 7), to come into electrically conducting contact at this point with corresponding conductor tracks provided on the printed circuit board 10.

The electrical connector element 1 can also be secured to the printed circuit board 10 by a manner other than soldering, for example by precise-fit insertion.

The housing 2 of the electrical connector element 1 is provided with projecting separating elements 4 made of an insulating material on its lower face 2a facing the printed circuit board 10, these being disposed at least partially between the connector pins 3 and projecting into or through additional openings 12 provided specifically for this purpose in the printed circuit board 10 in the assembled position.

In the present exemplary embodiment the separating elements 4 extend essentially parallel to the connector pins 3 or perpendicular to the lower face 2a of the housing 2 and thus perpendicular to the upper face 10a and/or lower face 10b of the printed circuit board 10, the separating element 4 preferably being disposed in the center between two adjacent connector pins 3.

This significantly enlarges a voltage path 16 shown in FIG. 3, this being the path the electrons have to cover in the event of a short circuit to travel from one connector pin 3 to the next connector pin 3. While in the case of a conventional electrical connector element 1 the voltage path 16 corresponds essentially to an axial distance 19 between two adjacent connector pins 3, more precisely a gap 13 shown in FIG. 7 between the outer sleeves of the connector pins 3, where a separating element 4 is provided the voltage path 16 is made up of path segments 16a, 16b and 16c and/or 16d, 16e and 16f (also shown in FIG. 7), which in total result in a longer path than the one the current flow would have to take to short circuit the axial distance 19 or the gap 13.

Figure 7:
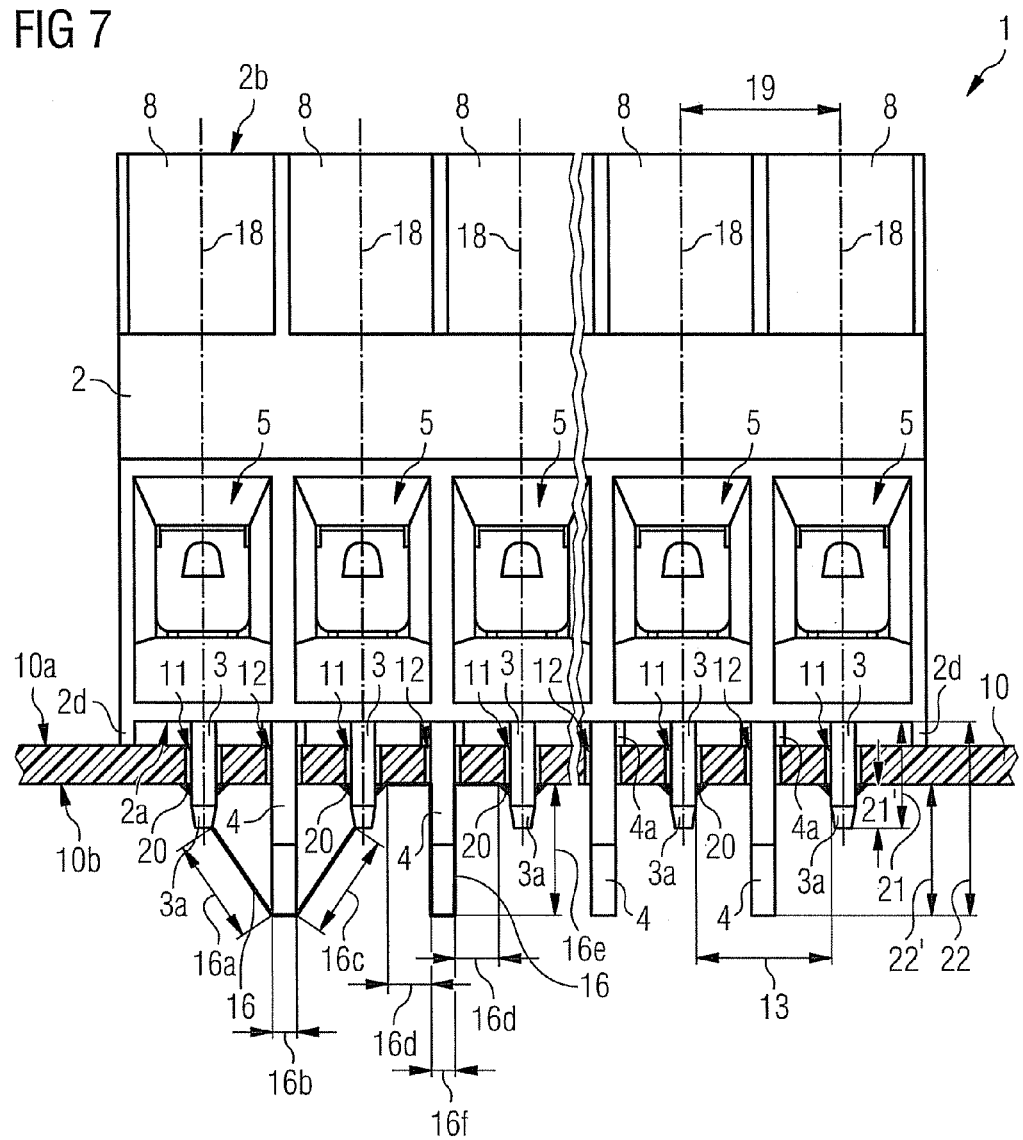
FIG. 7 shows a front view of an electrical connector element soldered to a printed circuit board

To produce a short circuit the current flow can take an "air path", which corresponds essentially to the sum of the path segments 16a, 16b and 16c or a "creepage path" which corresponds essentially to the sum of the path segments 16d, 16e, 16f, 16e and 16d and runs along the lower face 10b of the printed circuit board 10 and the surface of the separating element 4. As shown in FIG. 7, to calculate the path segment 16d of the "creepage path" running along the lower face 10b of the printed circuit board 10, it is not possible simply to take the distance between the connector pin 3 and separating element 4 running parallel to the axial distance 19, as the width of the electrically conducting solder material 20 applied to the printed circuit board 10 has to be taken into account or be subtracted from the distance between the connector pin 3 and the separating element 4.

Both the sum of the path segments 16a, 16b and 16c, in other words the "air path", and the sum of the path segments 16d, 16e, 16f, 16e and 16d, in other words the "creepage path", have to be sufficiently large, in other words at least as large as the "air path" and "creepage path" safe distances required by standard and described in the introduction. It is thus essential that the length 22, 22' shown in FIG. 7 and the width 23 of the separating element 4 shown in FIG. 6 are selected so that this requirement is met, with the "air path" and "creepage path" now no longer occurring as a respectively single linear path but as a discontinuous path made up of a number of path segments as a result of the "obstacle" formed by the separating element 4. It is evident that the "air path" and the "creepage path" can optionally be made up of different and/or more path segments than are shown in the present exemplary embodiment if the separating element 4 is embodied in a different geometric manner from the one shown in FIG. 7.

Specifically the provision of separating elements 4 means that for example in the case of an electrical connector element 1 with a rated supply voltage of 600 V, for which the "creepage path" safe distance required by standard or the gap 13 between two connector pins 3 is set at 12.7 mm per se according to a US standard, this gap 13 can now be reduced to around 6 mm while still ensuring short circuit protection. The electrical connector elements 1, which are provided for a rated voltage of 600 V, have an axial distance 19 between the connector pins 3 of only 6.35 mm, for which the connector pin diameter is 1 mm.

It should also be ensured here that a further voltage path 16g between the clamp connectors 5 and/or the clamping cages 9 is sufficiently large, in that the walls 5b forming the holder 5a extend sufficiently far away from the conducting components of the clamping cage 9. Equally the molded elements 8 have to be deep enough or a further voltage path 16h has to be large enough to prevent flashover between adjacent actuation elements 7, or more specifically between the heads 17 of the actuation elements 7, which are disposed in the openings 8a of the molded elements 8.

To prevent dielectric breakdown through the separating element 4 and also to prevent the separating elements 4 breaking off during assembly or during operation of the electrical connector element 1, e.g. due to vibration, the separating element 4 must have a certain minimum wall thickness. The wall thickness of the separating element 4, which according to FIG. 7 corresponds to the lengths of the path segments 16b and/or 16f, is therefore around 0.95 mm in the present exemplary embodiment.

The separating element 4 is embodied as essentially rectangular but can however have chamfers 4b or be rounded off at its corner regions to enable optimal insertion capability of the separating elements 4 into the corresponding openings 11 in the printed circuit board 10. The connector pins 3 are also preferably provided with a conical end region 3a, to allow better insertion capability for these too into the printed circuit board 10.

Instead of the rectangular form shown the separating element 4 can of course also be embodied in a different manner, for example in the manner of a shield and/or convex/concave or as a polygon.

If the connector pins 3 do not project in a perpendicular manner from the lower face 2a of the housing 2 or from a line corresponding to an axial distance 19 between two connector pins 3 but at a different angle, the geometry of the separating element 4 can of course also be tailored to this profile of the connector pins 3. It is however always essential that two adjacent connector pins 3 are separated from one another as effectively as possible by the separating element 4, in that the voltage distance 16 between the connector pins 3 is enlarged using all the available surface of the separating element 4, which in the present exemplary embodiment is rectangular.

Instead of an arrangement of the separating element 4 on the housing 2 of the electrical connector element 1 it is also possible to provide it on the lower face 10b of the printed circuit board 10, it being possible for the separating element 4 either to be embodied as an integral part of the printed circuit board 10 or to be attached as a separate component to the lower face 10b of the printed circuit board 10.

With such a variant it must simply be ensured that the lower face 2a of the housing 2 and the upper face 10a of the printed circuit board 10 make close contact with one another, in other words without air inclusions, in order to avoid the risk of flashover between the connector pins 3 in this region. To this end, while the electrical connector element 1 is being assembled on the printed circuit board 10, a material layer can be provided between the lower face 2a of the housing 2 and the upper face 10a of the printed circuit board 10, this having an adequate specific resistance and reliably filling any hollow spaces in said region, for example a suitable plastic or adhesive layer.

Regardless of whether the separating element 4 is disposed on the electrical connector element 1 or on the printed circuit board 10, in the present exemplary embodiment the projecting separating element 4 extends by a length 22' measured from the lower face 10b of the printed circuit board 10 and running perpendicular to this latter, said length 22' being greater, preferably twice as long as the length 21' of the connector pin 3 respectively adjacent to the separating element 4 projecting beyond the lower face 10b of the printed circuit board 10. If the separating element 4 is assigned by means of production technology to the housing 2 of the electrical connector element 1 and/or molded on this, FIG. 7 shows a length 22 of the separating element 4 measured from the lower face 2a of the housing 2 and extending in the direction of the printed circuit board 10 in the assembled position to be greater than a length 21 of a connector pin 3 adjacent to the separating element 4.

In the present exemplary embodiment the connector pin 3 projects out, for example by a length 21' of 1.9 mm, beyond the lower face 10b of the printed circuit board 10, with the length 22' of the separating element 4 measured from the lower face 10b of the printed circuit board 10 being 5.6 mm. The length 22' of the separating element 4 therefore exceeds the length 21' of the connector pin 3 by 3.7 mm, being thus roughly three times as long as it. These geometric conditions mean that the sum of the path segments 16a, 16b and 16c, in other words the "air path", is 9.7 mm, while the sum of the path segments 16d, 16e, 16f, 16e and 16d, in other words the "creepage path", is 16 mm. The connector pins 3 can thus be disposed in a space-saving manner with an axial distance 19 of 6.35 mm between them without fear of a short circuit.

In the present exemplary embodiment the separating element 4 is disposed precisely in the center between two adjacent connector pins 3, it being clear from the side view in FIG. 6 that a width 23 of the separating element running normal to the longitudinal axis 18 of the connector pins 3 and/or normal to the gap 13 shown in FIG. 7 is similarly selected so that the separating element 4 provides an adequate shielding effect. The connector pin 3 here is disposed expediently in the region of the center of the width 23 of the separating element 4 (looked at in side view as in FIG. 6) and/or the separating element 4 is disposed essentially symmetrically in relation to the connector pin 3 in respect of the extension of its width 23 running essentially in a normal direction to the gap 13.

In the exemplary embodiment in FIG. 7 it can also be seen that the lower face 2*a* of the housing 2 is not in direct contact with the upper face 10*a* of the printed circuit board 10 but is held at a slight distance from the upper face 10*a* of the printed circuit board 10 by means of web segments 2*d* molded on the lower face 2*a* of the housing 2 and/or by means of shoulder segments 4*a* of the separating elements 4, the diameter of which is greater than that of the openings 11.

Depending on the specific configuration of the components disposed on the printed circuit board 10, it is possible to modify the concept of providing separating elements 4 between the connector pins 3 with the result that the connector pins 3 can also be shielded from other regions than those shown in the present FIGS. 1-8.

If for example a number of electrical connector elements 1, 1' are disposed in an adjoining manner on the printed circuit board 10, one or more additional separating elements 4' can be provided to separate the connector pins 3 of a first electrical connector element 1 and the connector pins 3' of an adjoining second electrical connector element 1' from one another (not shown but see also the schematic diagram of a further additional opening 12', which is provided to hold an additional separating element 4', according to FIG. 1).

In such an instance where there are a number of adjacent electrical connector elements 1, 1', the at least one additional separating element 4' can also be disposed in a position other than the one shown in FIG. 1 with reference to the additional opening 12'. The additional separating element 4' is preferably disposed in any peripheral region of the lower face 2*a* of the housing 2 and can for example also be disposed in a region of the housing 2 adjacent to the clamp connectors 5.

The shielding and/or insulating effect of the separating elements 4 can also be increased by embodying the separating element 4 in the faun of a shaft, so that any number of the connector pins 3, when viewed in a plan view normal to the lower face 10*b* of the printed circuit board 10, is surrounded by the separating element 4 or enclosed at a greater or lesser distance (likewise not shown). In other words in such an instance the separating element 4 has a shaft-type holder, within which a connector pin 3 is disposed and separated from adjacent connector pins 3. The periphery of the connector pins 3 here can be bounded by the separating element 4 either partially (at any distance from the separating element 4) or even completely where the separating element 4 is produced together with the printed circuit board 10. To this extent the separating element 4 and the additional separating element 4' can also merge with one another at least partially and can be produced in an integral manner with one another.

The separating element 4 is preferably made of plastic, as this has a good insulating effect or electric strength at 30-130 [kV/mm]. It is however also possible to manufacture the separating element 4 using other insulating materials, e.g. materials containing ceramic or glass elements.

It is clear that a generic system can also have additional projecting plug-in elements and openings, which are disposed either on the electrical connector element 1 or on the printed circuit board 10, these being intended simply to prevent incorrect positioning of the electrical connector element 1 on the printed circuit board 10 and not to be confused with the separating elements 4 in respect of functionality.

To ensure that no flashover occurs between the conductor tracks (not shown in the present figures) of the printed circuit board 10 leading away from the openings 11 for the connector pins 3 due to the close arrangement of the connector pins 3 at less than the safe distance required by standard, provision can be made for these conductor tracks leading away from the openings 11 or connector pins 3 either to lead into an insulated layer of a multilayer printed circuit board and thus to be insulated from one another or for the printed circuit board 10 to be covered at least partially with an additional insulating layer.

The invention claimed is:

1. An electrical connector element for connecting two conductors to a printed circuit board or to conductor tracks disposed on the printed circuit board, comprising:
   a housing;
   two connectors for the two conductors, the connectors being configured as clamp connectors, wherein each connector having an actuation element and clamping cages, wherein each clamping cage is separated by a wall of the housing;
   two adjacent connector pins for a solderable connection to the printed circuit board or the conductor tracks; and
   a separating element made of an insulating material, the separating element being at least partly disposed between the connector pins and extending through the printed circuit board,
   wherein the separating element is arranged on a lower face of the housing, the lower face facing the printed circuit board,
   a plurality of tubular molded element extending from an upper surface of the housing, wherein each molded element forms an opening, which communicates with respective clamping cage for an actuation of the actuating element and
   wherein each wall also extends sufficiently far away from the respective clamping cage and the opening of the molded element is deep enough to prevent flashover between conducting components of the clamping cages or the actuation elements.

2. The electrical connector element as claimed in claim 1, wherein the separating element projects in an essentially normal direction from the lower face of the housing.

3. The electrical connector element as claimed in claim 1, wherein the separating element is disposed in the center between the two adjacent connector pins and extends in a normal direction to an axial distance between the connector pins.

4. The electrical connector element as claimed in claim 1, wherein a length of the separating element measured from the lower face of the housing and extending in the direction of the printed circuit board and a width of the separating element running along the lower face of the housing respectively are selected such that both an "air path" to be covered by the current present at the connector pins to travel round the separating element and causing a short circuit between the two adjacent connector pins and a "creepage path" running along a lower face of the printed circuit board and the upper face of the separating element to be covered by the current to travel round the separating element and causing a short circuit between the two adjacent connector pins respectively are at least as large, preferably larger, than a corresponding "air path" safe distance required by standard or a "creepage path" safe distance.

5. The electrical connector element as claimed in claim 1, wherein the separating element is an integral part of the housing.

6. The electrical connector element as claimed in claim 1, wherein the separating element is made of plastic.

7. The electrical connector element as claimed in claim 1, wherein the separating element has a rounded or chamfered rectangular form.

8. The electrical connector element as claimed in claim 1, wherein the separating element is embodied in the form of a shaft and surrounds any number of connector pins at least partially.

9. An arrangement, comprising:
a printed circuit board with an upper face and a lower face and with conductor tracks;
two conductors;
an electrical connector element assembled on the upper face of the printed circuit board configured to connect the two conductors to the conductor tracks of the printed circuit board, the electrical connector element having
a housing,
two connectors for the conductors, the connectors being configured as clamp connectors, wherein each connector having an actuation element and clamping cages, wherein each clamping cage is separated by a wall of the housing and
two connector pins for a solderable connection to the printed circuit board or the conductor tracks, the printed circuit board being provided with openings to hold the connector pins,
a separating element disposed at least partially between the connector pins,
a plurality of tubular molded element extending from an upper surface of said housing, and wherein each molded element forms an opening which communicates with respective clamping cage for an actuation of an actuation of actuating element and wherein the respective wall also extends sufficiently far away from the respective clamping cage and the opening of the molded element is deep enough to prevent flashover between conducting components of the clamping cages or the actuation elements.

10. The arrangement as claimed in claim 9, wherein the separating element is disposed on a lower face of the housing of the electrical connector element facing the printed circuit board and is an integral part of the housing and the printed circuit board is provided with an additional opening through which the separating element extends.

11. The arrangement as claimed in claim 9, wherein the separating element extends in an essentially normal direction to a plane formed by the printed circuit board.

12. The arrangement as claimed in claim 9, wherein the separating element is disposed in the center between the two connector pins and extends in a normal direction to an axial distance between the connector pins.

13. The arrangement as claimed in claim 9, wherein a length of the separating element measured from the lower face of the printed circuit board and a width of the separating element running normal to this respectively are selected such that both an "air path" to be covered by the current present at the connector pins to travel round the separating element and causing a short circuit between the two connector pins and a "creepage path" running along the lower face of the printed circuit board and the upper face of the separating element to be covered by the current to travel round the separating element and causing a short circuit between the two connector pins respectively are at least as large, preferably larger, than a corresponding "creepage path" safe distance required by standard or an "air path" safe distance.

14. The arrangement as claimed in claim 9, wherein the separating element is made of plastic.

15. The arrangement as claimed in claim 9, wherein the separating element has a rounded or chamfered rectangular form.

16. The arrangement as claimed in claim 9, wherein the separating element is embodied in the form of a shaft and surrounds any number of connector pins at least partially in a plan view normal to the lower face of the printed circuit board.

* * * * *